US010021792B2

(12) United States Patent
Miao

(10) Patent No.: US 10,021,792 B2
(45) Date of Patent: Jul. 10, 2018

(54) REMOTE CONTROLLER

(71) Applicant: SHENZHEN TCL NEW TECHNOLOGY CO., LTD., Guangdong (CN)

(72) Inventor: Liheng Miao, Guangdong (CN)

(73) Assignee: SHENZHEN TCL NEW TECHNOLOGY CO., LTD., Shenzhen (CN)

( * ) Notice: Subject to any disclaimer, the term of this patent is extended or adjusted under 35 U.S.C. 154(b) by 423 days.

(21) Appl. No.: 14/910,064

(22) PCT Filed: Jan. 24, 2014

(86) PCT No.: PCT/CN2014/071412
§ 371 (c)(1),
(2) Date: Feb. 4, 2016

(87) PCT Pub. No.: WO2015/035746
PCT Pub. Date: Mar. 19, 2015

(65) Prior Publication Data
US 2016/0174391 A1 Jun. 16, 2016

(30) Foreign Application Priority Data

Sep. 13, 2013 (CN) .......................... 2013 1 0420015

(51) Int. Cl.
*H05K 5/00* (2006.01)
*G08C 17/02* (2006.01)
*H05K 5/03* (2006.01)

(52) U.S. Cl.
CPC ........... *H05K 5/0017* (2013.01); *G08C 17/02* (2013.01); *H05K 5/0004* (2013.01); *H05K 5/0026* (2013.01); *H05K 5/03* (2013.01)

(58) Field of Classification Search
CPC .. G06F 1/1662; H05K 5/0017; H05K 5/0004; H05K 5/0026; G08C 17/02
See application file for complete search history.

(56) References Cited

U.S. PATENT DOCUMENTS

| 6,983,175 | B2 * | 1/2006 | Kwon | G06F 1/1616 |
| | | | | 345/168 |
| 7,492,893 | B2 * | 2/2009 | Ahn | G06F 1/1622 |
| | | | | 379/433.04 |

(Continued)

FOREIGN PATENT DOCUMENTS

| DE | 10059981 A1 | 6/2002 |
| WO | 2011133243 A1 | 10/2011 |

OTHER PUBLICATIONS

Extended European search report of counterpart European Patent Application No. 14844720.4 dated May 11, 2017.

*Primary Examiner* — Courtney Smith
*Assistant Examiner* — Jessey R Ervin

(57) ABSTRACT

Disclosed is a remote controller. The remote controller comprises a first panel and a second panel. The first panel is connected to the second panel by using a rotating connecting mechanism. The rotating connecting mechanism comprises a fixation base fixed to the first panel, a rotating shaft fixed to the second panel, and a sliding component. The sliding component comprises: an arc-shaped sliding rail disposed in the circumference direction of an outer sidewall of the rotating shaft; elastic pieces disposed on the fixation base in the axial direction of the rotating shaft and provided with circular holes; and rolling balls disposed between the arc-shaped sliding rail and the circular holes in an abutted mode. The arc-shaped sliding rail is fitted to the rolling balls in a sliding mode. Two ends of the arc-shaped sliding rail are higher than the middle of the arc-shaped sliding rail in the axial direction of the rotating shaft. The size of the remote (Continued)

controller in the present invention is reduced on the basis that function buttons have sufficient space; and the first panel and the second panel are effectively prevented from rubbing against each other when the remote controller is turned on or turned off, and accordingly, function buttons of the first panel can be prevented from being abraded and damaged.

19 Claims, 4 Drawing Sheets

(56) References Cited

U.S. PATENT DOCUMENTS

| | | | |
|---|---|---|---|
| 7,899,503 B2* | 3/2011 | Chen | H04M 1/0227 455/550.1 |
| 8,797,735 B2* | 8/2014 | Ge | H04M 1/0247 16/366 |
| 2004/0192398 A1* | 9/2004 | Zhu | H04M 1/0227 455/566 |
| 2004/0203517 A1* | 10/2004 | Park | H04M 1/0227 455/90.3 |
| 2007/0119024 A1* | 5/2007 | Kim | G06F 1/1616 16/337 |
| 2007/0289097 A1* | 12/2007 | Barnett | G06F 1/1616 16/342 |
| 2012/0224300 A1* | 9/2012 | Holman, IV | H04M 1/0227 361/679.01 |

* cited by examiner

REMOTE CONTROLLER

BACKGROUND

Technical Field

The present invention relates to the field of remote control technologies, and in particular, to a rotatable remote controller.

Related Art

With multifunctionalization of a TV, function buttons on a remote controller of the TV also gradually increase correspondingly. However, all traditional remote controllers are bar-shaped. With increase of the function buttons, such bar-shaped remote controllers can meet a requirement for space that accommodates the function buttons only be lengthening operation panels, so that outline size of the remote controllers increases and it is difficult to operate the remote controllers.

SUMMARY

A main objective of the present invention is to provide a remote controller, to decrease outline size of the remote controller on the basis of ensuring that function buttons have enough accommodation space, thereby facilitating users to operate the remote controller.

The present invention provides a remote controller, including a first panel and a second panel that are provided with multiple function buttons, where the first panel is rotationally connected to the second panel by using a rotating connecting mechanism; the rotating connecting mechanism includes a fixation base fixed to the first panel, a rotating shaft fixed to the second panel, and a sliding component; the sliding component includes an arc-shaped sliding rail disposed in the circumference direction of an outer sidewall of the rotating shaft, elastic pieces disposed on the fixation base in the axial direction of the rotating shaft and provided with circular holes, and rolling balls disposed between the arc-shaped sliding rail and the circular holes in an abutted mode; the arc-shaped sliding rail is fitted to the rolling balls in a sliding mode; and two ends of the arc-shaped sliding rail are higher than the middle of the arc-shaped sliding rail in the axial direction of the rotating shaft.

Preferably, the radius of the circular holes is less than that of the rolling balls.

Preferably, the two ends of the arc-shaped sliding rail are identical in height in the axial direction of the rotating shaft; when the ends of the arc-shaped sliding rail slide to the rolling balls, a distance between the first panel and the second panel is minimum in the axial direction of the rotating shaft.

Preferably, a central position of the arc-shaped sliding rail is the lowest point in height in the axial direction of the rotating shaft; when the central position of the arc-shaped sliding rail slides to a corresponding rolling ball, the distance between the first panel and the second panel is maximum in the axial direction of the rotating shaft.

Preferably, at least two groups of sliding components are disposed, and arc-shaped sliding rails corresponding to the at least two groups of sliding components are evenly distributed in the circumference direction of the outer sidewall of the rotating shaft; circular holes corresponding to the at least two groups of sliding components are evenly distributed on a circumference where the circular holes are located.

Preferably, the rotating connecting mechanism further includes a cover plate fixed to the fixation base, the cover plate being provided with an annular through hole that accommodates the rotating shaft; positions, which correspond to the elastic pieces, on a sidewall of the annular through hole are provided with openings; the width of the openings is greater than or equal to the diameter of the rolling balls and less than the width of the elastic pieces, so that the corresponding rolling balls are disposed between the circular holes of the elastic pieces and the corresponding arc-shaped sliding rails.

Preferably, on one end where the cover plate is connected to the fixation base, two sides of the elastic pieces are provided with bumps that are in contact with the elastic pieces in an abutted mode.

Preferably, the two ends of the arc-shaped sliding rails are separately set to be in a shape of an arc-shaped groove.

Preferably, a radical included angle between the two ends of the arc-shaped sliding rails is 90 degrees.

Preferably, the fixation base is fixed to a central position of the first panel, and the rotating shaft is fixed to a central position of the second panel, so that the central position of the first panel is rotationally connected to the central position of the second panel; a channel that accommodates an FPC is disposed inside the rotating shaft, and the FPC enables the first panel to be electrically connected to the second panel.

The present invention provides a remote controller. The remote controller includes a first panel and a second panel that are provided with multiple function buttons, and the first panel is rotationally connected to the second panel by using a rotating connecting mechanism; therefore, on the basis that the function buttons have enough accommodation space, outline size of the remote controller is reduced, thereby facilitating users to operate the remote controller. Moreover, an arc-shaped sliding rail is disposed in the circumference direction of an outer sidewall of a rotating shaft of the rotating connecting mechanism, elastic pieces are disposed on a fixation base in the axial direction of the rotating shaft and provided with circular holes, rolling balls are disposed between the arc-shaped sliding rail and the circular holes in an abutted mode, and in the axial direction of the rotating shaft, the height of one end of the arc-shaped sliding rail to the other end gradually decreases and then gradually increases; therefore, in a process that a user rotates the second panel to turn off or turn on the remote controller, a gap will be generated between the first panel and the second panel, which can effectively prevent the function buttons of the first panel from rubbing against the bottom of the second panel, thereby ensuring that the function buttons of the first panel are prevented from being abraded and damaged in the process of turning off or turning on the remote controller, improving the quality of the remote controller, and prolonging the service life of the remote controller.

Implementation of the objective, the functional characteristics, and the advantages of the present invention are further described with reference to the embodiments and the accompanying drawings.

DETAILED DESCRIPTION

It should be understood that the specific embodiments described herein are merely for explaining the present invention, but are not intended to limit the present invention.

Figure 1:
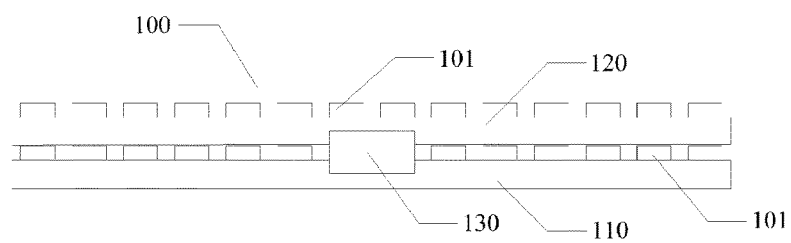
FIG. 1 is a schematic structural diagram of a remote controller in an off state according to the present invention.
Figure 4:
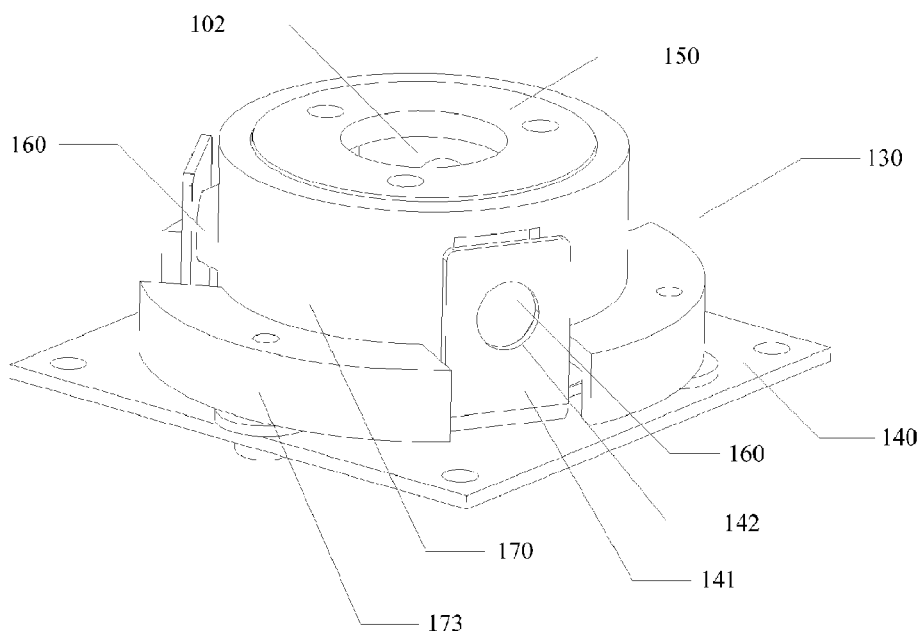
FIG. 4 is an assembly diagram of a rotating connecting mechanism in a remote controller according to the present invention.
Figure 5:
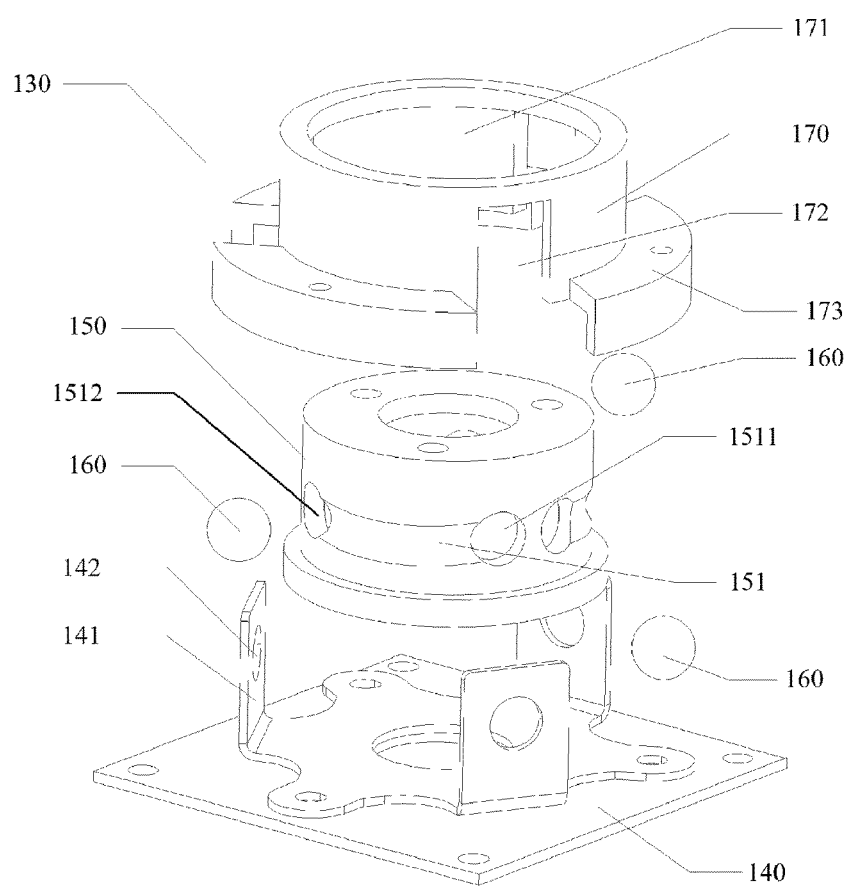
FIG. 5 is a split view of a rotating connecting mechanism in a remote controller according to the present invention.

Referring to FIG. 1, FIG. 4 and FIG. 5, an embodiment of a remote controller 100 according to the present invention is provided. The remote controller 100 includes a first panel 110 and a second panel 120 that are provided with multiple function buttons. The first panel 110 is rotationally connected to the second panel 120 by using a rotating connecting mechanism 130. The rotating connecting mechanism 130 includes a fixation base 140 fixed to the first panel 110, a rotating shaft 150 fixed to the second panel 120, and a sliding component. The sliding component includes an arc-shaped sliding rail 151 disposed in the circumference direction of an outer sidewall of the rotating shaft 150, elastic pieces 141 disposed on the fixation base 140 in the axial direction of the rotating shaft 150 and provided with circular holes 142, and rolling balls 160 disposed between the arc-shaped sliding rail 151 and the circular holes 142 in an abutted mode. The arc-shaped sliding rail 151 is fitted to the rolling balls 160 in a sliding mode. Two ends of the arc-shaped sliding rail 151 are higher than the middle of the arc-shaped sliding rail 151 in the axial direction of the rotating shaft 150. That is, when the rolling ball 160 is in a position of one end of the arc-shaped sliding rail 151, the first panel 110 and the second panel 120 are in an overlapped or fully-opened state.

Referring to FIG. 5, in this embodiment, the two ends of the arc-shaped sliding rail 151 are identical in height in the axial direction of the rotating shaft 150, and a central position of the arc-shaped sliding rail 151 is the lowest point in height in the axial direction of the rotating shaft 150. In addition, the two ends of the arc-shaped sliding rail 151 are separately set to be in a shape of an arc-shaped groove.

Figure 2:
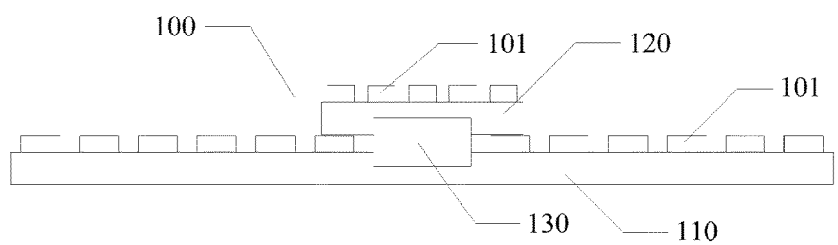
FIG. 2 is a schematic structural diagram of a remote controller in a fully-opened state according to the present invention.
Figure 3:
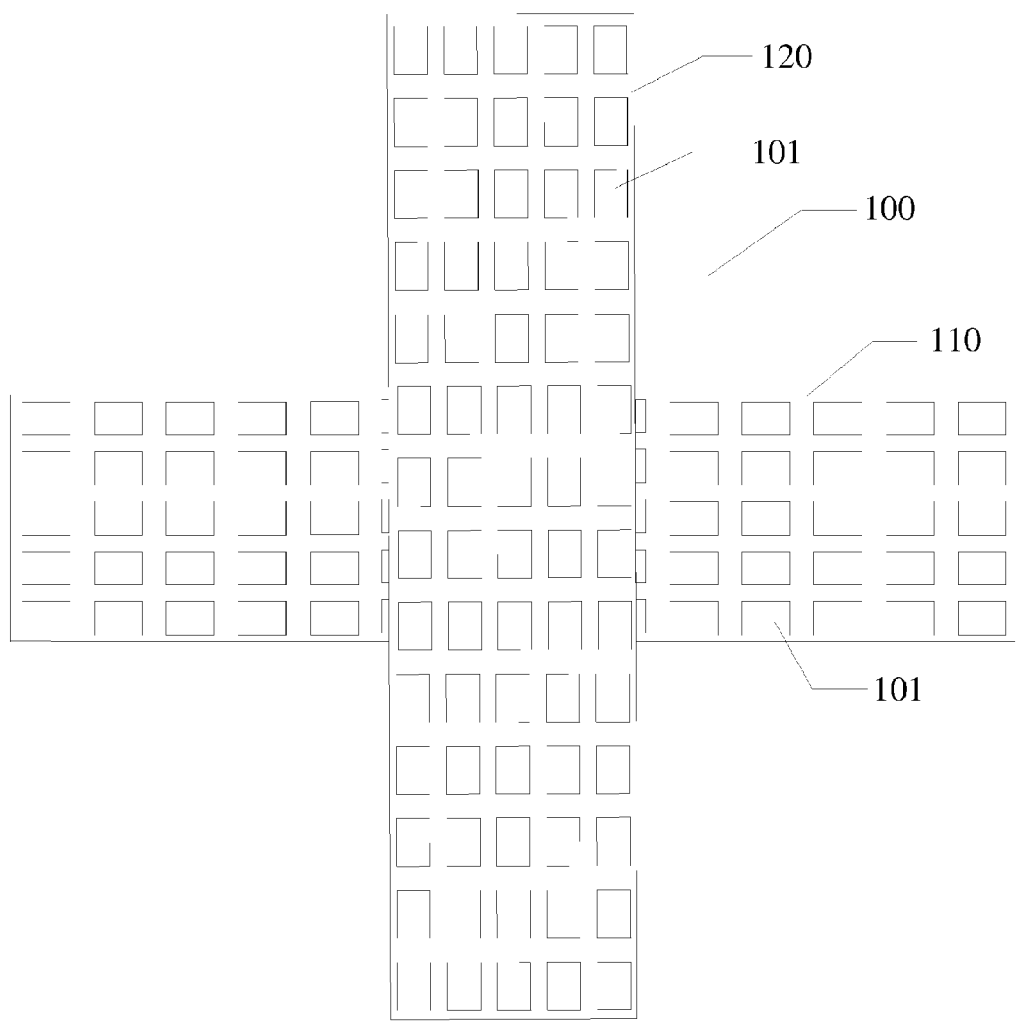
FIG. 3 is a top view of FIG. 2.

Referring to FIG. 5, in this embodiment, one end of the arc-shaped sliding rail 151 is marked as 1511, and the other end is marked as 1512. It may be set that when the rolling ball 160 abuts between the end 1511 and a corresponding circular hole 142, the first panel 110 and the second panel 120 are in an overlapped state, as shown in FIG. 1; and when the rolling ball 160 abuts between the end 1512 and the corresponding circular hole 142, the first panel 110 and the second panel 120 are in a fully-opened state, as shown in FIG. 2 and FIG. 3.

In this embodiment, in the axial direction of the rotating shaft 150, the height of one end of the arc-shaped sliding rail 151 to the other end gradually decreases and then gradually increases, while the circular hole 142 and the rolling ball 160 remain unchanged in height in the axial direction of the rotating shaft 150, so, when a user needs to change the first panel 110 and the second panel 120 from the overlapped state into a fully-opened state (before opening, the end 1511 of the arc-shaped sliding rail 151 is disposed at a corresponding rolling ball), the user should rotate the second panel 120 anticlockwise, and in a process of rotating the second panel 120 anticlockwise, the arc-shaped sliding rail 151 slides along the corresponding rolling ball 160. While making anticlockwise rotation, the second panel 120 moves to a direction away from the first panel 110 in the axial direction of the rotating shaft 150. When a central position of the arc-shaped sliding rail 151 slides to the corresponding rolling ball 160, the distance between the first panel 110 and the second panel 120 is maximum in the axial direction of the rotating shaft 150 (spacing between the first panel 110 and the second panel 120 is maximum). In this case, if the second panel 120 is rotated anticlockwise continuously, while making anticlockwise rotation, the second panel 120 moves to a direction close to the first panel 110 in the axial direction of the rotating shaft 150 until the end 1512 of the arc-shaped sliding rail 151 slides to the rolling ball 160. In this case, the first panel 110 and the second panel 120 are in a fully-opened state and the distance between the first panel 110 and the second panel 120 in the axial direction of the rotating shaft 150 is restored (spacing between the first panel 110 and the second panel 120 is minimum).

When the user needs to change the first panel 110 and the second panel 120 from the opened state into the overlapped state (in a fully-opened state, the end 1512 of the arc-shaped sliding rail 151 is disposed in a corresponding rolling ball 160), the user should rotate the second panel 120 clockwise, and in a process of rotating the second panel 120 clockwise, the arc-shaped sliding rail 151 slides along the corresponding rolling ball 160. While making clockwise rotation, the second panel 120 moves to a direction away from the first panel 110 in the axial direction of the rotating shaft 150. When the central position of the arc-shaped sliding rail 151 slides to the corresponding rolling ball 160, the distance between the first panel 110 and the second panel 120 is maximum in the axial direction of the rotating shaft 150 (spacing between the first panel 110 and the second panel 120 is maximum). In this case, if the second panel 120 is rotated clockwise continuously, while making clockwise rotation, the second panel 120 moves to a direction close to the first panel 110 in the axial direction of the rotating shaft 150 until the end 1511 of the arc-shaped sliding rail 151 slides to the rolling ball 160. In this case, the first panel 110 and the second panel 120 are in an overlapped state and the distance between the first panel 110 and the second panel 120 in the axial direction of the rotating shaft 150 is restored (spacing between the first panel 110 and the second panel 120 is minimum).

In addition, the remote controller 100 in this embodiment may also be set as follows: when the rolling ball 160 abuts between the end 1511 and a corresponding circular hole 142, the first panel 110 and the second panel 120 are in a fully-opened state; and when the rolling ball 160 abuts between the end 1512 and the corresponding circular hole 142, the first panel 110 and the second panel 120 are in an overlapped state. In this case, if it is necessary to change the first panel 110 and the second panel 120 from the overlapped state into the fully-opened state, the second panel 120 should be rotated clockwise. However, if it is necessary to change the first panel 110 and the second panel 120 from the fully-opened state into the overlapped state, the second panel 120 should be rotated anticlockwise.

In summary, according to the remote controller 100 provided in the present invention, in a process of turning off or turning on the remote controller 100, a gap will be generated between the first panel 110 and the second panel 120, so that a phenomenon that function buttons 101 on the first panel 110 rub against the bottom of the second panel 120 can be effectively prevented, thereby ensuring that the function buttons 101 of the first panel 110 are prevented from being abraded and damaged in the process of turning off or turning on the remote controller 100, improving the quality of the remote controller 100, and prolonging the service life of the remote controller 100.

In this embodiment, the radius of the circular hole 142 is less than that of the rolling ball 160, to ensure that the rolling ball 160 will not slide out of the circular hole 142. The rolling ball 160 is made from a rigid material, for example, a steel material.

In the present invention, to enable the second panel 120 to rotate stably relative to the first panel 110 in the process of turning on or turning off the remote controller 100, at least two groups of sliding components are disposed, and at least two arc-shaped sliding rails 151 corresponding to the at least two groups of sliding components are evenly distributed in the circumference direction of the outer sidewall of the rotating shaft 150; and at least two circular holes 142 corresponding to the at least two groups of sliding components are evenly distributed on a circumference where the circular holes 142 are located. Preferably, referring to FIG. 4 and FIG. 5, three groups of sliding components are disposed; and three arc-shaped sliding rails 151 corresponding to the three groups of sliding components are evenly distributed in the circumference direction of the outer sidewall of the rotating shaft 150; and three circular holes 142 corresponding thereto are evenly distributed on a circumference where the circular holes 142 are located.

Further, referring to FIG. 5, in the foregoing embodiment of the remote controller 100, a radical included angle between the two ends of the arc-shaped sliding rail 151 is 90 degrees. Referring to FIG. 1, FIG. 2 and FIG. 3, when the first panel 110 and the second panel 120 are in an overlapped state, it is only necessary to rotate the second panel 120 90 degrees relative to the first panel 110. In this way, the first panel 110 and the second panel 120 may be fully opened. Similarly, when the first panel 110 and the second panel 120 are in a fully-opened state, it is only necessary to rotate the second panel 120 90 degrees relative to the first panel 110. In this way, the first panel 110 and the second panel 120 may be closed, so that the first panel 110 and the second panel 120 are in an overlapped state. It should be understood that, by adjusting the radical included angle between the two ends of the arc-shaped sliding rail 151, degrees of a maximum included angle at which the first panel 110 and the second panel 120 can be opened may be adjusted.

Referring to FIG. 1 and FIG. 2, in this embodiment, the fixation base 140 may be fixed to a central position of the first panel 110, and the rotating shaft 150 is fixed to a central position of the second panel 120, so that the central position of the first panel 110 is rotationally connected to the central position of the second panel 120. Referring to FIG. 3, when the first panel 110 and the second panel 120 are in a fully-opened state, an included angle between a length direction of the first panel 110 and a length direction of the second panel 120 is 90 degrees, that is, the two length directions are perpendicular to each other and cross-shaped.

Referring to FIG. 4, in the foregoing embodiment of the remote controller 100, a channel 102 that accommodates an FPC is disposed inside the rotating shaft 150, and the FPC enables the first panel 110 to be electrically connected to the second panel 120.

Referring to FIG. 4 and FIG. 5, in the foregoing embodiment of the remote controller 100, the rotating connecting mechanism 130 further includes a cover plate 170 fixed to the fixation base 140, the cover plate 170 being provided with an annular through hole 171 that accommodates the rotating shaft 150; positions, which correspond to the elastic pieces 141, on a sidewall of the annular through hole 171 are provided with openings 172, so that the rolling balls 160 are disposed between the circular holes 142 of the elastic pieces 141 and the corresponding arc-shaped sliding rails 151.

Preferably, the width of the openings 172 is greater than or equal to the diameter of the rolling balls 160 and less than the width of the elastic pieces 141, to prevent the rolling balls 160 from sliding out of the arc-shaped sliding rails 151. On one end where the cover plate 170 is connected to the fixation base 140, two sides of the elastic pieces 141 are provided with bumps 173 that are in contact with the elastic pieces 141 in an abutted mode. In this embodiment, setting of the openings 172 enables the rolling balls 160 to be located precisely, which can prevent the rolling ball 160 from sliding out of the arc-shaped sliding rails 151 effectively. Moreover, setting of the bumps 173 may protect the elastic pieces 141 from being deformed.

It should be understood that, the above are merely preferred embodiments of the present invention, and thus cannot be used to limit the patent scope of the present invention. Any equivalent structure or equivalent process transformation made by using contents of the specification and the accompany drawings of the present invention or directly or indirectly used in other related technical fields shall also fall within the patent protection scope of the present invention.

What is claimed is:

1. A remote controller, comprising a first panel and a second panel that are provided with multiple function buttons; wherein the first panel is rotationally connected to the second panel by using a rotating connecting mechanism; the rotating connecting mechanism comprises a fixation base fixed to the first panel, a rotating shaft fixed to the second panel, and a sliding component; the sliding component comprises an arc-shaped sliding rail disposed in the circumference direction of an outer sidewall of the rotating shaft, elastic pieces disposed on the fixation base in the axial direction of the rotating shaft and provided with circular holes, and rolling balls disposed between the arc-shaped sliding rail and the circular holes in an abutted mode; the arc-shaped sliding rail is fitted to the rolling balls in a sliding mode; and two ends of the arc-shaped sliding rail are higher than the middle of the arc-shaped sliding rail in the axial direction of the rotating shaft.

2. The remote controller according to claim 1, wherein the radius of the circular holes is less than that of the rolling balls.

3. The remote controller according to claim 1, wherein the two ends of the arc-shaped sliding rail are identical in height in the axial direction of the rotating shaft; when the ends of the arc-shaped sliding rail slide to the rolling balls, a distance between the first panel and the second panel is minimum in the axial direction of the rotating shaft.

4. The remote controller according to claim 1, wherein a central position of the arc-shaped sliding rail is the lowest point in height in the axial direction of the rotating shaft; when the central position of the arc-shaped sliding rail slides to a corresponding rolling ball, the distance between the first panel and the second panel is maximum in the axial direction of the rotating shaft.

5. The remote controller according to claim 4, wherein at least two groups of sliding components are disposed, and arc-shaped sliding rails corresponding to the at least two groups of sliding components are evenly distributed in the circumference direction of the outer sidewall of the rotating shaft; circular holes corresponding to the at least two groups of sliding components are evenly distributed on a circumference where the circular holes are located.

6. The remote controller according to claim 5, wherein the rotating connecting mechanism further comprises a cover plate fixed to the fixation base, the cover plate being provided with an annular through hole that accommodates the rotating shaft; positions, which correspond to the elastic pieces, on a sidewall of the annular through hole are provided with openings; the width of the openings is greater than or equal to the diameter of the rolling balls and less than the width of the elastic pieces, so that the corresponding rolling balls are disposed between the circular holes of the elastic pieces and the corresponding arc-shaped sliding rails.

7. The remote controller according to claim 6, wherein on one end where the cover plate is connected to the fixation base, two sides of the elastic pieces are provided with bumps that are in contact with the elastic pieces in an abutted mode.

8. The remote controller according to claim 5, wherein the two ends of the arc-shaped sliding rails are separately set to be in a shape of an arc-shaped groove.

9. The remote controller according to claim 5, wherein a radical included angle between the two ends of the arc-shaped sliding rails is 90 degrees.

10. The remote controller according to claim 9, wherein the fixation base is fixed to a central position of the first panel, and the rotating shaft is fixed to a central position of the second panel, so that the central position of the first panel is rotationally connected to the central position of the second panel; a channel that accommodates an FPC is disposed inside the rotating shaft, and the FPC enables the first panel to be electrically connected to the second panel.

11. A remote controller, comprising a first panel and a second panel that are provided with multiple function buttons; wherein the first panel is rotationally connected to the second panel by using a rotating connecting mechanism; the rotating connecting mechanism comprises a fixation base fixed to the first panel, a rotating shaft fixed to the second panel, and a sliding component; the sliding component comprises an arc-shaped sliding rail disposed in the circumference direction of an outer sidewall of the rotating shaft, elastic pieces disposed on the fixation base in the axial direction of the rotating shaft and provided with circular holes, and rolling balls disposed between the arc-shaped sliding rail and the circular holes in an abutted mode; the arc-shaped sliding rail is fitted to the rolling balls in a sliding mode; and two ends of the arc-shaped sliding rail are higher than the middle of the arc-shaped sliding rail in the axial direction of the rotating shaft; and the two ends of the arc-shaped sliding rail are identical in height in the axial direction of the rotating shaft; and when the ends of the arc-shaped sliding rail slide to the rolling balls, a distance between the first panel and the second panel is minimum in the axial direction of the rotating shaft.

12. The remote controller according to claim 11, wherein the radius of the circular holes is less than that of the rolling balls.

13. The remote controller according to claim 11, wherein a central position of the arc-shaped sliding rail is the lowest point in height in the axial direction of the rotating shaft; when the central position of the arc-shaped sliding rail slides to a corresponding rolling ball, the distance between the first panel and the second panel is maximum in the axial direction of the rotating shaft.

14. The remote controller according to claim 13, wherein at least two groups of sliding components are disposed, and arc-shaped sliding rails corresponding to the at least two groups of sliding components are evenly distributed in the circumference direction of the outer sidewall of the rotating shaft; circular holes corresponding to the at least two groups of sliding components are evenly distributed on a circumference where the circular holes are located.

15. The remote controller according to claim 14, wherein the rotating connecting mechanism further comprises a cover plate fixed to the fixation base, the cover plate being provided with an annular through hole that accommodates the rotating shaft; positions, which correspond to the elastic pieces, on a sidewall of the annular through hole are provided with openings; the width of the openings is greater than or equal to the diameter of the rolling balls and less than the width of the elastic pieces, so that the corresponding rolling balls are disposed between the circular holes of the elastic pieces and the corresponding arc-shaped sliding rails.

16. The remote controller according to claim 15, wherein on one end where the cover plate is connected to the fixation base, two sides of the elastic piece are provided with bumps that are in contact with the elastic pieces in an abutted mode.

17. The remote controller according to claim 14, wherein the two ends of the arc-shaped sliding rails are separately set to be in a shape of an arc-shaped groove.

18. The remote controller according to claim 14, wherein a radical included angle between the two ends of the arc-shaped sliding rails is 90 degrees.

19. The remote controller according to claim 18, wherein the fixation base is fixed to a central position of the first panel, and the rotating shaft is fixed to a central position of the second panel, so that the central position of the first panel is rotationally connected to the central position of the second panel; a channel that accommodates an FPC is disposed inside the rotating shaft, and the FPC enables the first panel to be electrically connected to the second panel.

* * * * *